United States Patent

[11] 3,590,480

[72] Inventors Theodore H. Johnson Jr. Poughkeepsie; Charles H. Locke, Wappingers Falls; Paul V. Robock, Hopewell Junction; Raymond D. Suelflow, Wappingers Falls, all of, N.Y.

[21] Appl. No. 764,810
[22] Filed Oct. 3, 1968
[45] Patented July 6, 1971

[54] METHOD OF MANUFACTURING A PULSE TRANSFORMER PACKAGE
11 Claims, 14 Drawing Figs.

[52] U.S. Cl. .......... 29/605, 29/602, 29/626, 29/627, 174/52, 336/65, 336/96, 336/192
[51] Int. Cl. .......... H01f 7/06
[50] Field of Search .......... 29/602, 605, 626, 627, 628; 336/192, 96, 65, 92; 174/52.6, 52

[56] References Cited

UNITED STATES PATENTS

| | | | |
|---|---|---|---|
| 2,391,038 | 12/1945 | Rifenbergh | 29/602 UX |
| 2,823,360 | 2/1958 | Jones | 336/65 |
| 3,287,795 | 11/1966 | Chambers et al. | 29/627 |
| 3,340,347 | 9/1967 | Spiegler | 174/52 |
| 3,483,495 | 12/1969 | Clark et al. | 336/65 |
| 3,483,966 | 12/1969 | Dagnoli et al. | 336/65 X |
| 3,484,536 | 12/1969 | Jaeschke et al. | 174/52 |
| 3,493,908 | 2/1970 | Byers et al. | 336/96 |

*Primary Examiner*—John F. Campbell
*Assistant Examiner*—Carl E. Hall
*Attorney*—Hanifin and Jancin

ABSTRACT: A pulse transformer assembly including a wound core attached to a printed circuit board. Contact leads are attached to the printed circuit and the entire assembly, except for the leads, is encapsulated.

INVENTORS
THEODORE H. JOHNSON, JR
CHARLES H. LOCKE
PAUL V. ROBOCK
RAYMOND D SUELFLOW

BY Theodore E. Galanthay
AGENT

METHOD OF MANUFACTURING A PULSE TRANSFORMER PACKAGE

BACKGROUND OF THE INVENTION

1. Field of the Invention

This invention relates to electrical component assemblies and more specifically to miniaturized transformer assemblies and a method of making them. In the miniaturized circuit art, there is a need for very small transformers, magnetic amplifiers, and the like utilizing wires in the range of number 38 American Wire Gauge (AWG).

Generally, for transformer assemblies: the core is wound with thin wire, lead wires of a heavier gauge are attached to the thin wires, and the transformers thus made are encapsulated.

2. Description of the Prior Art

The prior art approach to the problem of manufacturing miniaturized transformer packages is exemplified by the three step illustration in FIG. 1. As an initial step, core 10 is wound with wires 12, which are very fine and not adapted for use as the lead wires of the transformer package. Therefore wires 12 are attached to lead wires 14 which are of a heavier gauge. Wires 14 are drawn through holes in casing 16 as shown in FIG. 1B. The core is then pushed into casing 16 which is filled with a potting compound to seal the assembly. Finally, leads 14 are cut off to a desired length.

Transformers made in this manner have a relatively high level of leakage inductance and a lack of uniformity in their electrical characteristics because of random positioning of wires 12 in casing 16. By random positioning of wires 12 is meant that when core 10 is jammed into casing 16, wires 12 assume a position which varies from one transformer assembly to the next. Injection of the potting compound further moves wires 12. Therefore, the positioning of wires 12 is indeterminable and varies with each transformer package. In addition, prior art techniques do not lend themselves to automatic assembly techniques and the manufacturing cost is therefore relatively high.

SUMMARY OF THE INVENTION

It is an object of this invention to provide inexpensive transformer packages by a manufacturing method particularly adapted to mechanized assembly.

Another object of this invention is to provide a miniaturized pulse transformer package with superior electrical characteristics.

A still further object of this invention is to provide a miniaturized pulse transformer package having low leakage inductance.

Lastly, another object of this invention is to provide pulse transformers with uniform and easily reproducible electrical characteristics.

In accordance with one aspect of this invention, ferrite cores are wound with bifilar, trifilar, or quadfilar wire. Contact leads are soldered to a printed circuit board. The cores are slipped onto a holding plug and this plug is press fit into an aperture in the printed circuit board, thereby mounting the core. The ends of the windings are then positioned and soldered to the printed circuit pattern, completing the assembly.

In accordance with another aspect of this invention, the transformer assembly is encapsulated. The assembly is inserted into a casing by sliding the printed circuit board into locating grooves inside the casing. The casing is then filled with a potting compound, encapsulating the assembly. In the alternative, the assembly is encapsulated with an apparatus which obviates the need for a casing. By this alternate method, the transformer assembly is positioned inside a closed space which serves as a molding chamber. Potting material is then injected to fill the chamber and surround the transformer assembly. As the potting material hardens, the molding chamber is separated and the transformer package is removed.

In automated mass production, the printed circuit board is produced in large sheets which are then cut into long strips. Registration holes are included on each individual printed circuit for subsequent positioning. Leads, which are also provided in long strips, are then attached to the strips of printed circuit board. This is conveniently done, for example, by passing a heated wheel over the contact area between the printed circuit board and leads, thereby soldering them together. The subassembly thus obtained is referred to as a carrier strip.

The cores are wound with multifilar wire and are mounted on the carrier strips by means of a plastic plug. The ends of the multifilar wire are, at this time, longer than needed in order to permit machine handling. A machine grasps these wires, splits them, and spreads them at a precise angle thereby positioning them over predetermined tabs in the land pattern (printed circuit pattern) of the printed circuit board. The ends of the multifilar wire are then attached to the land pattern by reflow soldering. See copending application Ser. No. 745,459, filed July 17, 1968, to Karl W. Beumer et al. entitled "Apparatus for Winding a Core and Splitting MultiStrand Wires," assigned to the assignee of this application. The carrier strip is then cut into segments, each segment being one transformer assembly. The entire assembly thus obtained is then encapsulated, except for the leads which will protrude from the resulting package.

In order to reduce leakage inductance and provide uniformity of electrical characteristics, flat ribbon cable is used as the multifilar wire, so that each of the wires is maintained in a spaced relationship from each other wire. The multifilar wire is usually bifilar, trifilar, or quadfilar, depending on the desired transformation ratio. Leakage inductance is further reduced by use of rectangular terminal leads. A very significant improvement in the uniformity of electrical characteristics among transformers is provided by the use of printed circuit boards in the manner described herein.

The foregoing and other objects, features and advantages will be apparent from the following more particular description of preferred embodiments of the invention, as illustrated in the accompanying drawings.

DESCRIPTION OF THE PREFERRED EMBODIMENTS

Figures 1A, 1B, 1C:
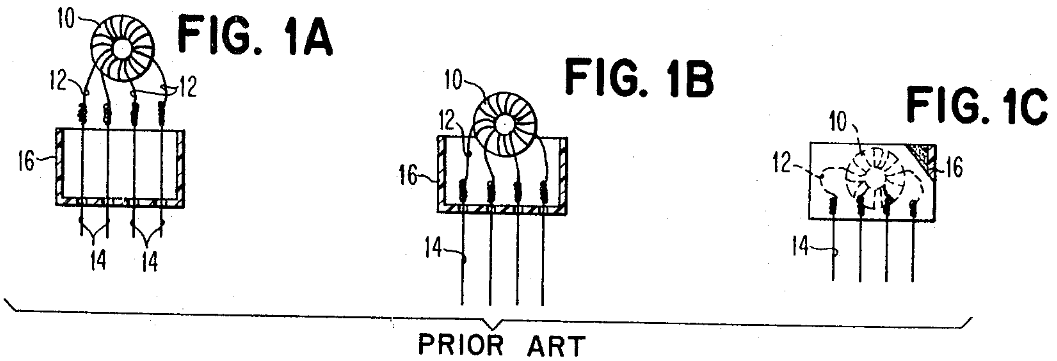
FIG. 1A, FIG. 1B, FIG. 1C PRIOR ART
FIG. 1A, 1B, and 1C depict the prior art.
Figure 2A:
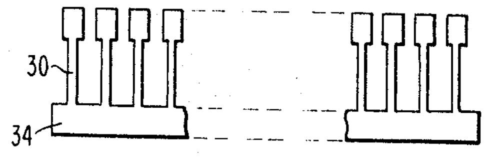
FIG. 2A shows a strip of leads.

Referring to FIG. 2A, there is shown a strip of leads consisting of integral sections 30 and 34. These leads can be manufactured by any one of a number of well known methods. For example, a large sheet of metal can be stamped to obtain the desired pattern. The resulting sheet can then be cut into strips to obtain the configuration shown in FIG. 2A.

Figure 2B:
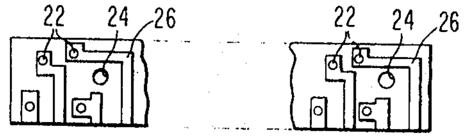
FIG. 2B shows a strip of printed circuit board.

Referring now to FIG. 2B, there is shown a strip of printed circuit board. The printed circuit board can also be made in a large sheet by conventional techniques. Preferably an epoxy glass substrate is used with plated through holes 22 and registration holes 24. Electrically conductive land pattern 26 can be formed by any one of numerous well-known techniques.

Figure 3:
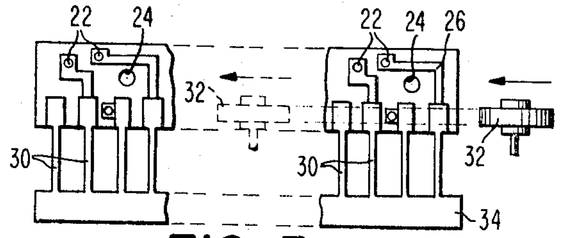
FIG. 3 shows a carrier strip constructed by attaching the strip of leads of FIG. 2A to the strip of printed circuit board of FIG. 2B.

With continued reference to FIGS. 2A and 2B, refer now to FIG. 3, which shows the assembly of a carrier strip by attaching a strip of leads (FIG. 2A) to a strip of printed circuit board (FIG. 2B). Leads 30 are placed over land pattern 26, and the two are soldered together. A convenient means of soldering is the use of a heated wheel 32 rolled over the leads and printed circuit board. Section 34 is then cut off.

Figure 4:
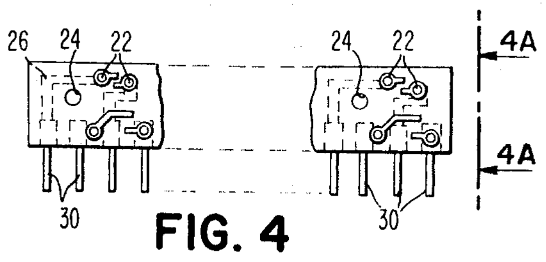
FIG. 4 is a back view of the carrier strip of FIG. 3.
Figure 4A:
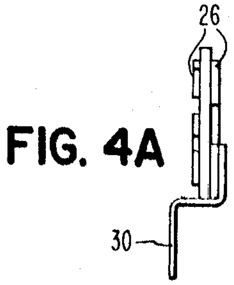
FIG. 4A is a side view of the carrier strip of FIG. 4 particularly showing the shaping of the leads.

Refer now to FIG. 4 which shows the backside of the carrier strip. The land pattern as seen in FIGS. 2B and 3 is now shown by dotted lines as it is on the reverse side of the printed circuit board. Note that plated through holes 22 and registration holes 24 appear on both sides. Through holes 22 connect land pattern 26 on both sides of the printed circuit board. For a side view of the carrier strip see FIG. 4A, which particularly shows land pattern 26 on both sides of the printed circuit board, FIG. 4A also shows the shaping of leads 30 which assures that they subsequently protrude from the middle of the package and also improves the structural strength of the assembly.

Figure 5:
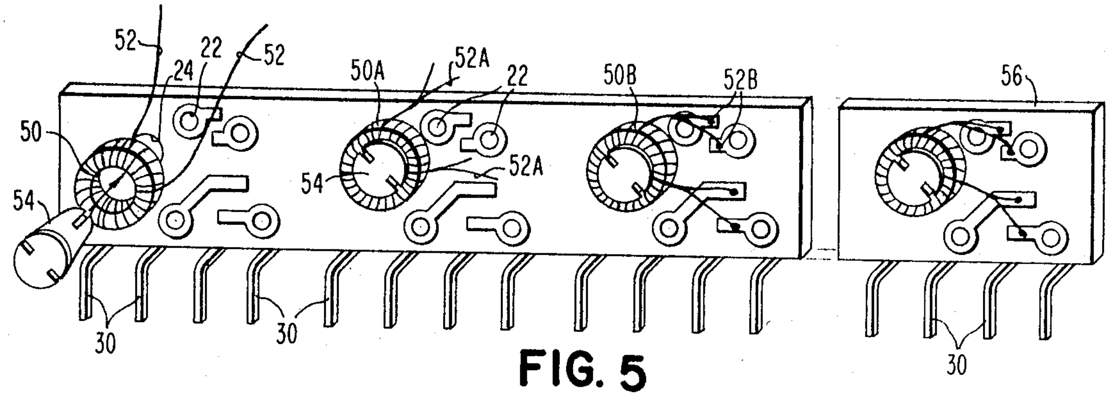
FIG. 5 shows a carrier strip and wound cores in various stages of assembly.

Refer now to FIG. 5 which shows a carrier strip and wound cores in four stages of assembly. The particular configuration has been chosen solely for purposes of illustration. Note also that the particular land pattern is for bifilar wire for transformers with a 1:1 turns ratio. Land patterns for other multifilar wires such as tirifilar and quadfilar wire will immediately suggest themselves to those skilled in the art. As shown in FIG. 5, core 50 is wound with bifilar wire 52. In the first stage of assembly, the wound core is attached to the carrier strip by means of plastic plug 54. Any other convenient attaching means is contemplated to be within the scope of this invention. In the second stage of assembly, core 50A is already attached to the carrier strip and the ends of bifilar wire 52A are cut and split. In the third stage of assembly, bifilar wire 52B is positioned and attached to the land pattern. In the fourth stage of assembly, as represented in FIG. 5, a complete individual transformer assembly is severed from the remainder of the carrier strip.

Figure 5A:
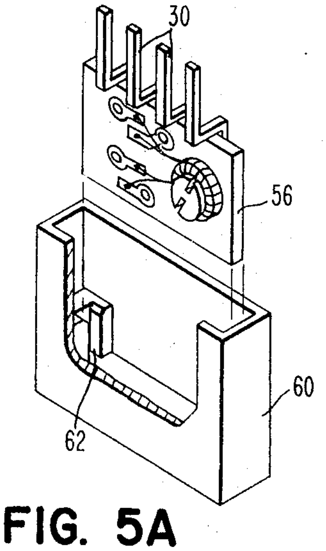
FIG. 5A is a cutaway view of a transformer assembly and casing particularly showing the grooves in the casing.
Figure 5B:
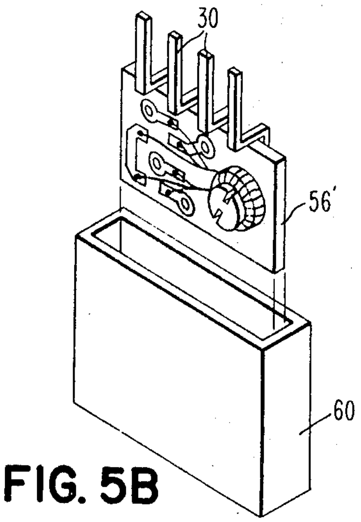
FIG. 5B illustrates the insertion of a transformer assembly into a casing.
Figure 5C:
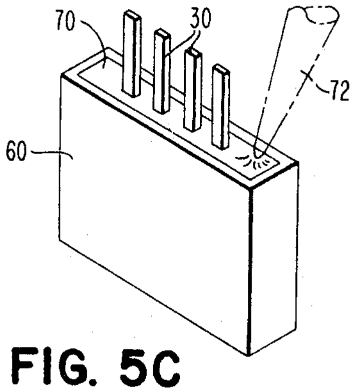
FIG. 5C illustrates the filling of the casing with potting material.

The last step is encapsulation which can be accomplished by several alternative techniques. A first technique is shown in FIGS. 5A, 5B, and 5C. FIG. 5A shows the transformer assembly about to be inserted into casing 60. Note groove 62 visible through the cutaway section. The printed circuit board is inserted into grooves 62 (the second groove is hidden from view) maintaining the transformer assembly 56 is in a spaced relationship from the walls of casing 60. FIG. 5B also shows the insertion of a completed assembly into casing 60. However, note that in FIG. 5B transformer assembly 56' has a core wound with trifilar wire. This illustrates the particular land pattern that can be used if transformers utilizing trifilar wire for 2:1 turns ratio transformers are to be made. FIG. 5C illustrates the final step of encapsulation. Potting material 70 is inserted into casing 60 by means of nozzle 72. In the alternative, the potting material can be inserted into casing 60 prior to inserting assembly 56. In either case, a negative meniscus is left. The particular shaping of leads 30 permits transformer assembly 56 to be inserted into casing 60 without straining the joint between the leads and the land pattern on the printed circuit board. The particular shaping of leads 30 also assures that the leads will protrude from the middle of the opening in casing 60. Further note the rectangular shape of leads 30 which assures minimum leakage inductance.

Figure 6B:
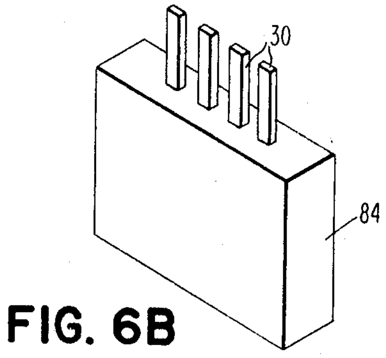
FIG. 6B shows a complete transformer package formed by the encapsulation technique of FIG. 6A.
Figure 6A:
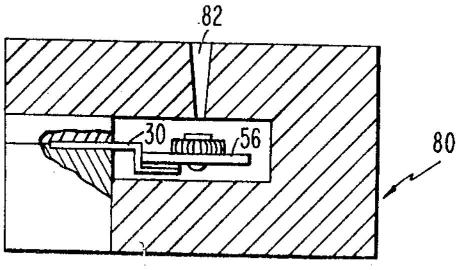
FIG. 6A shows an alternate encapsulation technique.

An alternate encapsulation technique is illustrated in FIG. 6A. The transformer assembly 56 is held by leads 30 inside a molding chamber. In practice, encapsulating apparatus 80 has many chambers for simultaneous encapsulating of a great number of transformer assemblies 56. A potting material is forced into the chamber through nozzle 82. After the potting material hardens, the packaged assembly is removed and the resulting package 84 is shown in FIG. 6B. Only leads 30 protrude from the packaged transformer assembly. After encapsulation by either of the aforementioned techniques, the transformer package is cured, thereby permanently setting the potting compound.

In conclusion, a method has been disclosed for manufacturing miniature packaged transformer assemblies. The method particularly lends itself to mechanized assembly and mass production. The resultant transformer packages are produced at a lower cost with improved characteristics. Particularly, the transformer packages of this invention have a low leakage inductance, and a high level of reproducability in that the wiring configuration of each assembly is practically identical to that of each subsequently produced transformer assembly.

While the invention has been particularly shown and described with reference to preferred structures and methods, it will be understood by those skilled in the art that various changes in form and detail may be made therein without departing from the spirit and scope of the invention.

What we claim is:

1. The method of making a discrete miniature pulse transformer package comprising the steps of:
   - soldering leads to one side of a printed circuit board having a conductive land pattern on both sides thereof;
   - rigidly mounting a wound transformer core with an insulating means to the opposite side of the printed circuit board from said leads
   - soldering the ends of the windings to the conductive land pattern thereby completing the miniaturized transformer assembly; and
   - encapsulating said assembly thereby completing the transformer package.

2. The method of making a miniaturized pulse transformer package comprising the steps of:
   - winding a transformer core with multifilar wire cable;
   - rigidly mounting said transformer core to a printed circuit board;
   - separating the ends of said multifilar wire cable;
   - attaching the ends of said multifilar wire cable to the printed circuit on said printed circuit board;
   - attaching leads to the printed circuit on said printed circuit board, thereby completing the miniaturized transformer assembly; and
   - encapsulating the assembly thereby completing the making of the transformer package.

3. The method of making a miniaturized pulse transformer package comprising the steps of:
   - attaching leads to the land pattern of a printed circuit board;
   - winding a transformer core with multifilar wire cable;
   - attaching said transformer core to said printed circuit board;
   - separating the ends of said multifilar wire cable;
   - attaching the ends of said multifilar wire cable to predetermined portions of the land pattern on said printed circuit board, thereby completing the transformer assembly; and
   - encapsulating said transformer assembly, thereby completing the making of the pulse transformer package.

4. The method of claim 3 wherein:
   - said transformer core is attached to a side of the printed circuit board opposite the side to which the leads are attached.

5. The automated method of making miniaturized pulse transformer packages comprising the steps of:
   - cutting a printed circuit board having a plurality of identical land patterns thereon, into strips;
   - cutting a plurality of leads into strips;
   - attaching a strip of leads to a strip of printed circuit board;
   - attaching transformer cores having windings thereon to said printed circuit board;
   - soldering the ends of the windings to predetermined portions of the land pattern on said strip of printed circuit board;
   - cutting said strip of printed circuit board into individual transformer assemblies; and encapsulating said transformer assemblies, thereby forming complete transformer packages.

6. The method of claim 5 wherein the step of encapsulating additionally includes:

sliding the printed circuit board into grooves in a casing, thereby spacing said transformer assembly from the walls of said casing.

7. The automated method of making miniaturized pulse transformer packages comprising the steps of:

cutting a printed circuit board having a plurality of identical land patterns thereon, into strips;

cutting a plurality of leads into strips;

attaching a strip of leads to a strip of printed circuit board;

attaching transformer cores having windings thereon to said printed circuit board;

soldering the ends of the windings to predetermined portions of the land pattern on said strip of printed circuit board;

cutting said strip of printed circuit board into individual transformer assemblies;

positioning said individual transformer assemblies inside an encapsulating a cavity; and filling the encapsulating cavity with a potting compound, thereby forming a complete transformer package without the use of a casing.

8. The automated method of making miniaturized transformer packages comprising the steps of:

cutting printed circuit board having a plurality of identical land patterns thereon, into strips;

cutting a plurality of leads into strips;

attaching a strip of leads to a strip of printed circuit board;

attaching transformer cores having windings thereon to said printed circuit board;

soldering the ends of the windings to predetermined portions of the land pattern on said strip of printed circuit board;

encapsulating said strip of printed circuit board with the strip of leads and transformer cores attached thereto; and cutting said strip of printed circuit board into individual transformer assemblies.

9. The method of making a pulse transformer package comprising the steps of:

cutting a printed circuit board having a plurality of predetermined land patterns thereon, into strips;

attaching a conductive lead strip to predetermined portions of the land pattern on said strip of printed circuit board by means of soldering, thereby producing a carrier strip;

attaching a plurality of ferrite cores each having a multifilar wire thereon to said carrier strip;

splitting said multifilar wire spreading said multifilar wire at a precise angle, thereby positioning it over the land pattern of the printed circuit board;

attaching said multifilar wire to said printed circuit board by reflow soldering;

cutting said carrier strip into individual transformer units; and encapsulating each of said discrete transformer units.

10. The method of making a pulse transformer package comprising the steps of:

cutting a printed circuit board having a plurality of predetermined land patterns thereon, into strips;

attaching a conductive lead strip to predetermined portions of the land pattern on said strip of printed circuit board by means of soldering, thereby producing a carrier strip;

attaching a plurality of ferrite cores each having a multifilar wire thereon to said carrier strip;

splitting said multifilar wire;

spreading said multifilar wire at a precise angle, thereby positioning it over the land pattern of the printed circuit board;

attaching said multifilar wire to said printed circuit board by reflow soldering;

encapsulating said carrier strip and ferrite core mounted thereon; and cutting said carrier strip into individual transformer packages.

11. The automated method of producing discrete pulse transformer packages comprising the steps of:

attaching a strip of leads to a strip of printed circuit board forming a carrier strip;

cutting said carrier strip into discrete printed circuit boards;

positioning said discrete printed circuit board with respect to a wound transformer core wound with multifilar wire cables;

attaching said wound core to said discrete printed circuit boards;

splitting the multifilar wire; positioning the multifilar wire over predetermined portions of the printed circuit boards;

attaching the multifilar wire to predetermined portions of said discrete printed circuit boards; and cutting the ends of said multifilar wire, thereby completing the transformer assembly.

PO-1050
(5/69)

UNITED STATES PATENT OFFICE
CERTIFICATE OF CORRECTION

Patent No. 3,590,480 Dated July 6, 1971

Inventor(s) T.H.Johnson,Jr., C. H. Locke, P. V. Robock,R.D.Suelflow

It is certified that error appears in the above-identified patent and that said Letters Patent are hereby corrected as shown below:

In the line after "[45] Patented July 6, 1971"

insert -- [73] Assignee International Business
Machines Corporation
Armonk, New York --

Signed and sealed this 11th day of January 1972.

(SEAL)
Attest:

EDWARD M.FLETCHER,JR.
Attesting Officer

ROBERT GOTTSCHALK
Acting Commissioner of Patents